US011410830B1

(12) United States Patent
Xiao et al.

(10) Patent No.: US 11,410,830 B1
(45) Date of Patent: Aug. 9, 2022

(54) DEFECT INSPECTION AND REVIEW USING TRANSMISSIVE CURRENT IMAGE OF CHARGED PARTICLE BEAM SYSTEM

(71) Applicant: KLA-Tencor Corporation, Milpitas, CA (US)

(72) Inventors: Hong Xiao, Pleasanton, CA (US); Lawrence Muray, Milpitas, CA (US); Nick Petrone, Milpitas, CA (US); John Gerling, Livermore, CA (US); Abdurrahman Sezginer, Monte Sereno, CA (US); Alan D. Brodie, Palo Alto, CA (US); Kuljit Virk, Fremont, CA (US); Qiang Q. Zhang, San Jose, CA (US); Grace Hsiu-Ling Chen, Los Gatos, CA (US)

(73) Assignee: KLA Corporation, Milpitas, CA (US)

( * ) Notice: Subject to any disclaimer, the term of this patent is extended or adjusted under 35 U.S.C. 154(b) by 0 days.

(21) Appl. No.: 16/421,004

(22) Filed: May 23, 2019

Related U.S. Application Data

(60) Provisional application No. 62/822,848, filed on Mar. 23, 2019.

(51) Int. Cl.
*H01J 37/244* (2006.01)
*H01J 37/22* (2006.01)
*H01J 37/28* (2006.01)

(52) U.S. Cl.
CPC ............ *H01J 37/22* (2013.01); *H01J 37/244* (2013.01); *H01J 37/28* (2013.01); *H01J 2237/004* (2013.01); *H01J 2237/2817* (2013.01)

(58) Field of Classification Search
CPC .......... H01J 37/22; H01J 37/244; H01J 37/28; H01J 2237/004; H01J 2237/2817; H01L 21/66; G01R 31/305
(Continued)

(56) References Cited

U.S. PATENT DOCUMENTS 6,177,681 B1 *  1/2001  Nakamura ......... G01N 21/9501
250/341.4
6,559,662 B1  5/2003  Yamada et al.
(Continued)

FOREIGN PATENT DOCUMENTS

CN          1833174 A      9/2006
KR       20090109708 A    10/2009

OTHER PUBLICATIONS

Reimer, L., "Image Formation in Low-voltage Scanning Electron Microscopy", SPIE Press, 1993, p. 5.
(Continued)

*Primary Examiner* — Wyatt A Stoffa
(74) *Attorney, Agent, or Firm* — Suiter Swantz pc llo

(57) ABSTRACT

A system is disclosed. In one embodiment, the system includes a scanning electron microscopy sub-system including an electron source configured to generate an electron beam and an electron-optical assembly including one or more electron-optical elements configured to direct the electron beam to the specimen. In another embodiment, the system includes one or more grounding paths coupled to the specimen, the one or more grounding paths configured to generate one or more transmission signals based on one or more received electron beam-induced transmission currents. In another embodiment, the system includes a controller configured to: generate control signals configured to cause the scanning electron microscopy sub-system to scan the portion of the electron beam across a portion of the specimen; receive the transmission signals via the one or more grounding paths; and generate transmission current images based on the transmission signals.

17 Claims, 5 Drawing Sheets

(58) Field of Classification Search
USPC .......................................................... 250/310
See application file for complete search history.

(56) References Cited

U.S. PATENT DOCUMENTS

| | | | |
|---|---|---|---|
| 6,614,050 B1 | 9/2003 | Yamada et al. | |
| 6,614,244 B2 | 9/2003 | Yamada et al. | |
| 6,683,308 B2 | 1/2004 | Itagaki et al. | |
| 6,700,122 B2 | 3/2004 | Matsui et al. | |
| 6,711,453 B2 | 3/2004 | Yamada et al. | |
| 6,753,194 B2 | 6/2004 | Ushiki et al. | |
| 6,768,324 B1 | 7/2004 | Yamada et al. | |
| 6,787,770 B2 * | 9/2004 | Kikuchi | G01N 23/00 250/397 |
| 6,809,534 B2 | 10/2004 | Yamada | |
| 6,837,936 B2 | 1/2005 | Ushiki et al. | |
| 6,842,663 B2 | 1/2005 | Yamada et al. | |
| 6,850,079 B2 | 2/2005 | Yamada et al. | |
| 6,897,440 B1 | 5/2005 | Yamada | |
| 6,900,645 B2 | 5/2005 | Yamada | |
| 6,914,444 B2 | 7/2005 | Yamada | |
| 6,940,296 B2 | 9/2005 | Yamada | |
| 6,943,043 B2 | 9/2005 | Ushiki et al. | |
| 6,946,857 B2 | 9/2005 | Yamada et al. | |
| 6,967,327 B2 | 11/2005 | Yamada | |
| 6,975,125 B2 * | 12/2005 | Yamada | G01R 31/307 324/750.16 |
| 6,982,418 B2 * | 1/2006 | Yamada | G01N 23/2251 250/306 |
| 7,002,361 B2 * | 2/2006 | Yamada | G01B 15/02 324/702 |
| 7,049,834 B2 | 5/2006 | Yamada | |
| 7,232,994 B2 | 6/2007 | Yamada | |
| 7,279,689 B2 * | 10/2007 | Kadyshevitch | H01L 22/34 250/492.1 |
| 7,321,805 B2 | 1/2008 | Yamada et al. | |
| 7,388,365 B2 * | 6/2008 | Nokuo | H01J 37/244 324/754.03 |
| 7,476,875 B2 * | 1/2009 | Kadyshevitch | H01J 37/32935 250/492.1 |
| 7,580,124 B2 | 8/2009 | Yu | |
| 7,602,197 B2 * | 10/2009 | Kadyshevitch | G01R 31/307 324/501 |
| 8,039,813 B2 | 10/2011 | Casares et al. | |
| 8,680,466 B2 * | 3/2014 | Kanno | G01R 31/307 250/310 |
| 10,823,683 B1 * | 11/2020 | Nie | G01N 21/9505 |
| 2003/0104639 A1 * | 6/2003 | Kikuchi | G01N 23/00 438/8 |
| 2004/0084622 A1 | 5/2004 | Kadyshevitch et al. | |
| 2007/0057687 A1 * | 3/2007 | Kadyshevitch | G01R 31/307 324/762.05 |
| 2013/0119999 A1 * | 5/2013 | Obuki | H01L 22/14 324/501 |
| 2016/0093465 A1 | 3/2016 | Nagano et al. | |
| 2020/0411278 A1 * | 12/2020 | Nagai | H01J 37/265 |
| 2021/0270891 A1 * | 9/2021 | Komori | G01R 31/305 |

OTHER PUBLICATIONS

Ko, Yeong-Uk et al., "Modeling of Substrate Current Measurement and Charge Transfer in Insulators", Proc. of SPIE, vol. 6152, 615230 (2006), 11 pages.

Attota, Ravi Kiran et al., "Feasibility study on 3-D shape analysis of high-aspect-ratio features using through-focus scanning optical microscopy", NIST National Institute of Standards and Technology, published in final edited form as: Opt Express Jul. 25, 2016; 24(15): 16574-16585.

Nozoe, Mari et al., "Inspection-analysis Solution for High-quality and High-efficiency Device Manufacturing", Hitachi Review, vol. 54 (2005), No. 1, pp. 9-14.

Oberai, Ankush et al., "Smart E-Beam for Defect Identification & Analysis in the Nanoscale Technology Nodes: Technical Perspectives", Electronics 2017, 6, 87; doi:10.3390/electronics6040087, pp. 1-28, www.mdpi.com/journal/electronics.

Yamada, Keizo et al., "An in-line process monitoring method using electron beam induced substrate current", (Abstract) ScienceDirect, Elsevier, Microelectronics Reliability, vol. 41, Issue 3, Mar. 2001.

* cited by examiner

DEFECT INSPECTION AND REVIEW USING TRANSMISSIVE CURRENT IMAGE OF CHARGED PARTICLE BEAM SYSTEM

CROSS-REFERENCE TO RELATED APPLICATION

The present application claims the benefit under 35 U.S.C. § 119(e) of U.S. Provisional Application Ser. No. 62/822,848, filed Mar. 23, 2019, entitled DEFECT INSPECTION AND REVIEW USING TRANSMISSIVE CURRENT IMAGE OF CHARGED PARTICLE BEAM SYSTEM, naming Hong Xiao, Laurence Muray, Nick Petrone, John Gerling, Apo Sezginer, Alan Brodie, Kuljit Virk, Qiang Zhang, and Grace Chen as inventors, which is incorporated herein by reference in the entirety.

TECHNICAL FIELD

The present invention generally relates to specimen characterization and inspection, and, more particularly, to specimen characterization and inspection using electron beam-induced transmission currents.

BACKGROUND

Demand for electronic logic and memory devices with ever-smaller footprints and features present a wide range of manufacturing challenges beyond fabrication at a desired scale. For example, a major challenge of semiconductor sample fabrication (e.g., 3D-NAND devices) is the channel hole etch process. During the channel hole etch process, channel holes may be etched through seventy or more film stacks (e.g., silicon oxide (SiOx) film stacks, silicon nitride (SiN) film stacks, ON-ON stacks, and the like), which may be up to approximately ten micrometers (10 μm) thick. Further complicating the channel hole etch process, many current electronic logic and memory devices utilize multiple (e.g., three or more) pairs of film stacks (e.g., SiOx film stacks, polysilicon film stacks, OPOPOP stacks, and the like) beneath the ON-ON stack.

Currently, there is no inspection solution to detect a defect of interest (DOI) at the bottom of channel hole during the after-etch-inspection (AEI) stage. Some previous techniques have used voltage contrast (VC) inspection with an electron beam inspection (EBI) system after channel hole film deposition and polysilicon plug formation. However, if the under etched channel holes end in one of polysilicon layers of the OPOPOP stack, there will be no voltage contrast between normal contact plugs and under etched contact plugs, rendering VC inspection ineffective.

Other previous techniques have used electron beam inspection after polysilicon plug formation in order to detect DOIs at the bottom of channel holes during the AEI stage. However, it is well known that electron beam inspection is not able to capture these DOIs during the AEI stage. Additionally, using these previous techniques, inspection must be delayed for several days after channel holes have been etched in order to have an opportunity to capture DOIs within the under-etched channel holes. Furthermore, these previous techniques lack the sensitivity required to capture under-etched channel holes which land in a polysilicon layer of an ON-ON-OPOPOP hybrid stack.

Therefore, it would be desirable to provide a system and method that cure the shortfalls of the previous approaches identified above.

SUMMARY

A system is disclosed. In one embodiment, the system includes a scanning electron microscopy sub-system. The scanning electron microscopy sub system may include an electron source configured to generate an electron beam and an electron-optical assembly including one or more electron-optical elements configured to direct a portion of the electron beam onto a first side of a specimen. In another embodiment, the system includes one or more grounding paths coupled to a second side of the specimen different from the first side, the one or more grounding paths configured to receive one or more electron beam-induced transmission currents and generate one or more transmission signals based on the one or more electron beam-induced transmission currents. In another embodiment, the system includes a controller including one or more processors configured to: generate one or more control signals configured to cause the scanning electron microscopy sub-system to scan the portion of the electron beam across a portion of the specimen; receive the one or more transmission signals via the one or more grounding paths; and generate one or more transmission current images based on the one or more transmission signals.

A system is disclosed. In one embodiment the system includes a controller including one or more processors configured to execute a set of program instructions stored in memory, the set of program instructions configured to cause the one or more processors to: generate one or more control signals configured to scan a portion of the electron beam across a portion of a first side of a specimen; receive one or more transmission signals via one or more grounding paths coupled to a second side of the specimen; and generate one or more transmission current images based on the one or more transmission signals.

A method is disclosed. In one embodiment, the method includes: generating an electron beam with an electron source; scanning at least one portion of the electron beam across a portion of a specimen; receiving one or more transmission signals via one or more grounding paths coupled to the specimen; and generating one or more transmission current images based on the one or more transmission signals.

It is to be understood that both the foregoing general description and the following detailed description are exemplary and explanatory only and are not necessarily restrictive of the invention as claimed. The accompanying drawings, which are incorporated in and constitute a part of the specification, illustrate embodiments of the invention and together with the general description, serve to explain the principles of the invention.

BRIEF DESCRIPTION OF THE DRAWINGS

The numerous advantages of the disclosure may be better understood by those skilled in the art by reference to the accompanying figures in which.

DETAILED DESCRIPTION

Figure 1:
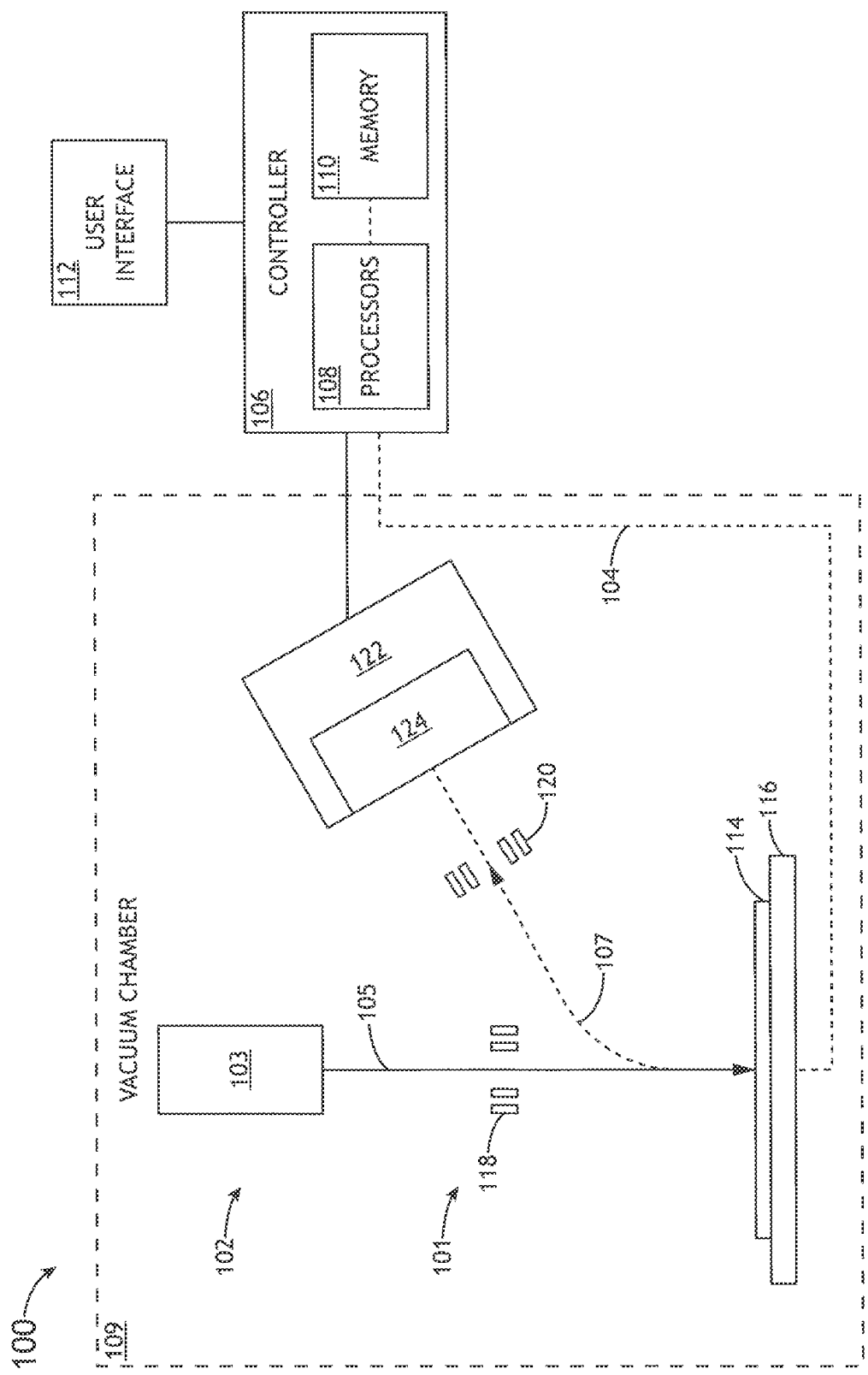
FIG. 1 illustrates a simplified block diagram of a scanning electron microscopy (SEM) characterization system, in accordance with one or more embodiments of the present disclosure.

The present disclosure has been particularly shown and described with respect to certain embodiments and specific features thereof. The embodiments set forth herein are taken to be illustrative rather than limiting. It should be readily apparent to those of ordinary skill in the art that various changes and modifications in form and detail may be made without departing from the spirit and scope of the disclosure.

Reference will now be made in detail to the subject matter disclosed, which is illustrated in the accompanying drawings.

Demand for electronic logic and memory devices with ever-smaller footprints and features present a wide range of manufacturing challenges beyond fabrication at a desired scale. For example, a major challenge of semiconductor sample fabrication (e.g., 3D-NAND devices) is the channel hole etch process. During the channel hole etch process, channel holes may be etched through seventy or more film stacks (e.g., silicon oxide (SiOx) film stacks, silicon nitride (SiN) film stacks, ON-ON stacks, and the like), which may be up to approximately ten micrometers (10 µm) thick. Further complicating the channel hole etch process, many current electronic logic and memory devices utilize multiple (e.g., three or more) pairs of film stacks (e.g., SiOx film stacks, polysilicon film stacks, OPOPOP stacks, and the like) beneath the ON-ON stack.

Currently, there is no inspection solution to detect a defect of interest (DOI) at the bottom of channel hole during the after-etch-inspection (AEI) stage. Some previous techniques have used voltage contrast (VC) inspection with an electron beam inspection (EBI) system after channel hole film deposition and polysilicon plug formation. However, if the under etched channel holes end in one of polysilicon layers of the OPOPOP stack, there will be no voltage contrast between normal contact plugs and under etched contact plugs, rendering VC inspection ineffective.

Other previous techniques have used electron beam inspection after polysilicon plug formation in order to detect DOIs at the bottom of channel holes during the AEI stage. However, it is well known that electron beam inspection is not able to capture these DOIs during the AEI stage. Additionally, using these previous techniques, inspection must be delayed for several days after channel holes have been etched in order to have an opportunity to capture DOIs within the under-etched channel holes. Furthermore, these previous techniques lack the sensitivity required to capture under-etched channel holes which land in a polysilicon layer of an ON-ON-OPOPOP hybrid stack.

Accordingly, embodiments of the present disclosure are directed to curing one or more shortfalls of the previous approaches identified above. Embodiments of the present disclosure are directed to generating one or more transmission current images of a specimen based on electron beam-induced transmission currents. Additional embodiments of the present disclosure are directed to a system and method for determining one or more characteristics of a specimen based on the one or more generated transmission current images.

It is contemplated herein that embodiments of the present disclosure may provide for more accurate and precise DOI detection within high-aspect ratio (HAR) structures (e.g., channel holes). In particular, it is contemplated herein that generating transmission current images based on transmission currents through a specimen may provide for DOI detection within thin under-etched non-conductive remain at the bottom of HAR structures.

FIG. 1 illustrates a simplified block diagram of a scanning electron microscopy (SEM) characterization system 100, in accordance with one or more embodiments of the present disclosure. The system 100 may include, but is not limited to, an SEM sub-system 102, one or more grounding paths 104 coupled to a specimen 114, and a controller 106 including one or more processors 108 and a memory 110.

In one embodiment, the SEM sub-system 102 is configured to perform characterization and/or inspection on the specimen 114. In this regard, the SEM sub-system 102 may be configured to acquire one or more images of the specimen 114. The SEM sub-system 102 may include, but is not limited to, an electron beam source 103 and an electron-optical assembly 101. In one embodiment, the electron optical assembly 101 includes one or more electron-optical elements 118 and one or more electron-optical elements 120. In further embodiments, the SEM sub-system 102 includes an electron detector assembly 122 including one or more electron sensors 124.

In one embodiment, at least a portion of the SEM sub-system 102 is contained within a vacuum chamber 109. For example, as shown in FIG. 1, the electron beam source 103, electron-optical assembly 101, and the electron detector assembly 122 may be contained within the vacuum chamber 109.

In one embodiment, the electron beam source 103 is configured to direct one or more electron beams 105 to the specimen 114. The electron beam source 103 may form an electron-optical column. In another embodiment, SEM sub-system 102 includes one or more additional and/or alternative electron-optical elements 118 configured to focus and/or direct the one or more electron beams 105 to the surface of the specimen 114. In another embodiment, SEM sub-system 102 includes one or more electron-optical elements 120 configured to collect secondary and/or backscattered electrons 107 emanated from the surface of the specimen 114 in response to the one or more electron beams 105. It is noted herein that the one or more electron-optical elements 118 and the one or more electron-optical elements 120 may include any electron-optical elements configured to direct, focus, and/or collect electrons including, but not limited to, one or more deflectors, one or more electron-optical lenses, one or more condenser lenses (e.g., magnetic condenser lenses), one or more objective lenses (e.g., magnetic condenser lenses), and the like.

Specimen 114 may include any specimen known in the art including, but not limited to, a wafer, a reticle, a photomask, and the like. In one embodiment, specimen 114 is disposed on a stage assembly 116 to facilitate movement of specimen 114. In another embodiment, the stage assembly 116 is an actuatable stage. For example, the stage assembly 116 may include, but is not limited to, one or more translational stages suitable for selectably translating the specimen 114 along one or more linear directions (e.g., x-direction, y-direction and/or z-direction). By way of another example, the stage assembly 116 may include, but is not limited to, one or more rotational stages suitable for selectively rotating the specimen 114 along a rotational direction. By way of another example, the stage assembly 116 may include, but is not limited to, a rotational stage and a translational stage suitable for selectably translating the specimen 114 along a linear direction and/or rotating the specimen 114 along a rotational direction. It is noted herein that the system 100 may operate in any scanning mode known in the art.

It is noted that the electron optical assembly of the SEM sub-system 102 is not limited to the electron-optical elements depicted in FIG. 1, which are provided merely for illustrative purposes. It is further noted that the system 100 may include any number and type of electron-optical elements necessary to direct/focus the one or more electron beams 105 onto the specimen 114 and, in response, collect and image the emanated secondary and/or backscattered electrons 107 onto the electron detector assembly 122.

For example, the system 100 may include one or more electron beam scanning elements (not shown). For instance, the one or more electron beam scanning elements may include, but are not limited to, one or more electromagnetic scanning coils or electrostatic deflectors suitable for controlling a position of the one or more electron beams 105 relative to the surface of the specimen 114. Further, the one or more scanning elements may be utilized to scan the one or more electron beams 105 across the specimen 114 in a selected pattern.

In another embodiment, secondary and/or backscattered electrons 107 are directed to one or more sensors 124 of the electron detector assembly 122. The electron detector assembly 122 of the SEM sub-system 102 may include any electron detector assembly known in the art suitable for detecting backscattered and/or secondary electrons 107 emanating from the surface of the specimen 114. In one embodiment, the electron detector assembly 122 includes an electron detector array. In this regard, the electron detector assembly 122 may include an array of electron-detecting portions. Further, each electron-detecting portion of the detector array of the electron detector assembly 122 may be positioned so as to detect an electron signal from specimen 114 associated with one of the incident one or more electron beams 105. In this regard, each channel of the electron detector assembly 122 may correspond to an electron beam 105 of the one or more electron beams 105. The electron detector assembly 122 may include any type of electron detector known in the art. For example, the electron detector assembly 122 may include a micro-channel plate (MCP), a PIN or p-n junction detector array, such as, but not limited to, a diode array or avalanche photo diodes (APDs). By way of another example, the electron detector assembly 122 may include a high-speed scintillator/PMT detector.

While FIG. 1 illustrates the SEM sub-system 102 as including an electron detector assembly 122 comprising only a secondary electron detector assembly, this is not to be regarded as a limitation of the present disclosure. In this regard, it is noted that the electron detector assembly 122 may include, but is not limited to, a secondary electron detector, a backscattered electron detector, and/or a primary electron detector (e.g., an in-column electron detector). In another embodiment, SEM sub-system 102 may include a plurality of electron detector assemblies 122. For example, system 100 may include a secondary electron detector assembly 122a, a backscattered electron detector assembly 122b, and an in-column electron detector assembly 122c.

In one embodiment, the one or more processors 108 are configured to analyze the output of electron detector assembly 122. In one embodiment, the set of program instructions are configured to cause the one or more processors 108 to analyze one or more characteristics of specimen 114 based on images received from the electron detector assembly 122. In another embodiment, the set of program instructions are configured to cause the one or more processors 108 to modify one or more characteristics of system 100 in order to maintain focus on the specimen 114 and/or the electron detector assembly 122. For example, the one or more processors 108 may be configured to adjust one or more characteristics of the electron beam source 103 and/or other elements of system 100 in order to focus the one or more electron beams 105 onto the surface of the specimen 114. By way of another example, the one or more processors 108 may be configured to adjust the one or more elements of system 100 in order to collect secondary/backscattered electrons 107 from the surface of the specimen 114 and focus the collected secondary/backscattered electrons 107 onto the electron detector assembly 122. By way of another example, the one or more processors 108 may be configured to adjust one or more focusing voltages applied to one or more electrostatic deflectors of electron beam source 103 in order to independently adjust the position or alignment of the one or more electron beams 105 and scan the electron beams 105 across the specimen 114.

In another embodiment, system 100 includes one or more grounding paths 104 configured to collect transmission currents from the specimen 114. In this regard, the one or more grounding paths 104 may be coupled to the specimen 114 and configured to electrically couple the specimen 114 to the controller 106. As used herein, the terms "transmission currents," "substrate currents," "electron beam-induced transmission currents," and like terms, may be used interchangeably, and may be regarded as referring to currents which are transmitted throughout the specimen 114 in response to one or more electron beams 105.

In another embodiment, the one or more processors 108 of the controller 106 may be configured to execute a set of program instructions stored in memory 110, the set of program instructions configured to cause the one or more processors 108 to carry out various steps/functions of the present disclosure. For example, the one or more processors 108 of the controller 106 may be configured to: generate one or more control signals configured to cause the scanning electron microscopy sub-system to scan the portion of the electron beam across a portion of the specimen; receive the one or more transmission signals via the one or more grounding paths; generate one or more transmission current images based on the one or more transmission signals, and determine one or more characteristics of the specimen based on the one or more transmission current images. Each of these steps will be addressed in turn.

In one embodiment, the one or more processors 108 are configured to generate one or more control signals configured to cause the SEM sub-system 102 to scan at least a portion of the specimen 114 with at least a portion of an electron beam 105. For example, the controller 106 may be configured to generate one or more control signals configured to cause the electron beam source 103 of the SEM sub-system 102 to generate one or more electron beams 105 and scan the one or more electron beams 105 across a first side (e.g., top/front side) of the specimen 114. In some embodiments, the electron beam source 103 includes a high-current (e.g., >1 nA) incident charged particle electron beam source. It is contemplated herein that the one or more control signals generated by the one or more processors 108 may include positional information indicating the position of the electron beam 105 on the specimen 114 as the electron beam 105 is scanned across the specimen 114. The control signals and positional information associated with the control signals may be stored in memory 110.

In another embodiment, the electron detector assembly 122 of the SEM sub-system 102 may be configured to collect a plurality of secondary/backscattered electrons 107 emanating from the surface of the specimen 114 in response to the one or more electron beams 105. In another embodiment, the electron controller 106 and/or detector assembly 122 is configured to generate one or more SEM images of the specimen 114 based on the plurality of detected secondary/backscattered electrons 107.

In another embodiment, the one or more processors 108 are configured to receive one or more transmission signals from the one or more grounding paths 104. For example, continuing with the same example above, one or more electron beam-induced transmission currents may be generated within the specimen 114 in response to the one or more electron beams 105. In one embodiment, the one or more grounding paths 104 may be coupled to a second side (e.g., bottom/back side) of the specimen 114 and configured to collect the one or more electron beam-induced transmission currents. The one or more grounding paths 104 may be further configured to receive/collect the one or more electron beam-induced transmission currents, generate one or more transmission signals based on the one or more electron beam-induced transmission currents, and provide the one or more transmission signals to the controller 106. The controller 106 may be configured to store data associated with the one or more transmission signals in memory 110.

It is contemplated herein that collecting one or more electron beam-induced transmission currents from a specimen 114 may include collecting one or more electron beam-induced transmission currents which have been transmitted through HAR structures (e.g., channel holes) of the specimen 114. For example, the specimen 114 may include a 3D-NAND structure including a plurality of channel holes which are to be inspected in the after-etch inspection (AEI) stage.

Figure 2A:
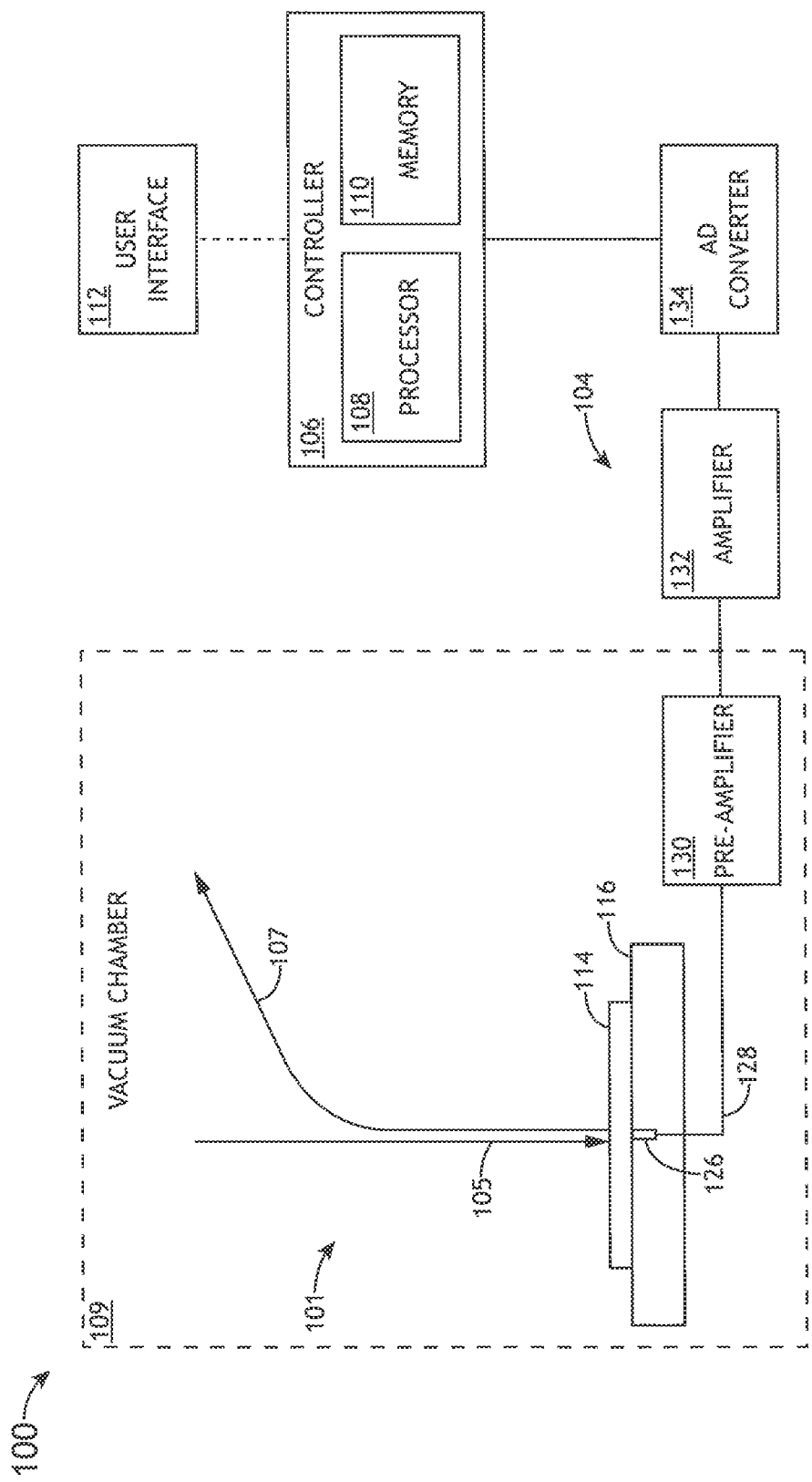
FIG. 2A illustrates a portion of a scanning electron microscopy (SEM) characterization system including one or more grounding paths, in accordance with one or more embodiments of the present disclosure.

FIG. 2A illustrates a portion of a scanning electron microscopy (SEM) characterization system 100 including one or more grounding paths 104, in accordance with one or more embodiments of the present disclosure.

The one or more grounding paths 104 may include any number and/or type of components configured to collect the electron beam-induced transmission currents, generate transmission signals based on the electron beam-induced transmission currents, and provide the transmission signals to the controller 106. For example, as shown in FIG. 2A, the one or more grounding paths 104 may include, but are not limited to, one or more grounding pins 126, one or more connecting traces 128, one or more amplifiers (e.g., preamplifier 130, amplifier 132, and the like), and an analog/digital converter (e.g., AD converter 134).

In one embodiment, the one or more grounding paths 104 include one or more grounding pins 126 coupled to the specimen 114. For example, as shown in FIG. 2A, the SEM sub-system 102 may be configured to direct the electron beam 105 to a first surface (e.g., front side) of the specimen 114, wherein the one or more grounding pins 126 are electrically coupled to a second surface (e.g., back side) of the specimen 114. The one or more grounding pins 126 may include any structures known in the art configured to electrically couple to the specimen 114 and collect the one or more electron beam-induced transmission currents from the specimen 114.

In another embodiment, the one or more grounding paths 104 include one or more connecting traces 128 configured to transmit the electron beam-induced transmission currents and/or the transmission signals from the specimen 114 to the controller 106. For example, each grounding pin 126 may be electrically coupled to a connecting trace 128 such that each grounding pin is electrically coupled to the controller 106. For instance, a first grounding pin 126a may be coupled to a first connecting trace 128a, a second grounding pin 126b may be coupled to a second connecting trace 128b, and the like. It is noted herein that the one or more connecting traces 128 may include any structure known in the art configured to transmit electrical currents/signals including, but not limited to, wires, cables, vias, and the like.

In another embodiment, the one or more grounding paths 104 are configured to amplify the one or more electron beam-induced transmission currents. In this regard, the one or more grounding paths 104 may include one or more amplifiers. For example, as shown in FIG. 2A, a grounding path 104 may include a pre-amplifier 130 and an amplifier 132. The pre-amplifier 130 may be disposed within the vacuum chamber 109 such that it is configured to amplify the electron beam-induced transmission currents prior to leaving the vacuum chamber 109 and/or reaching the amplifier 132. The pre-amplified electron beam-induced transmission currents may then be directed, via the connecting traces 128, to the amplifier 132. In embodiments, the amplifier 132 may be disposed outside of the vacuum chamber 109, and may be configured to further amplify the electron beam-induced transmission currents.

In another embodiment, the one or more grounding paths 104 may include an AD converter 134 configured to receive the electron beam-induced transmission currents and generate one or more transmission signals. For example, the AD converter 134 may receive one or more amplified electron beam-induced transmission currents from the amplifier 132 via the one or more connecting traces 128. The AD converter 134 may then be configured to convert the electron beam-induced transmission currents from an analog form to a digital form, and thereby generate the one or more transmission signals. The connecting traces 128 may then be further configured to provide the one or more transmission signals to the controller 106.

Figure 2B:
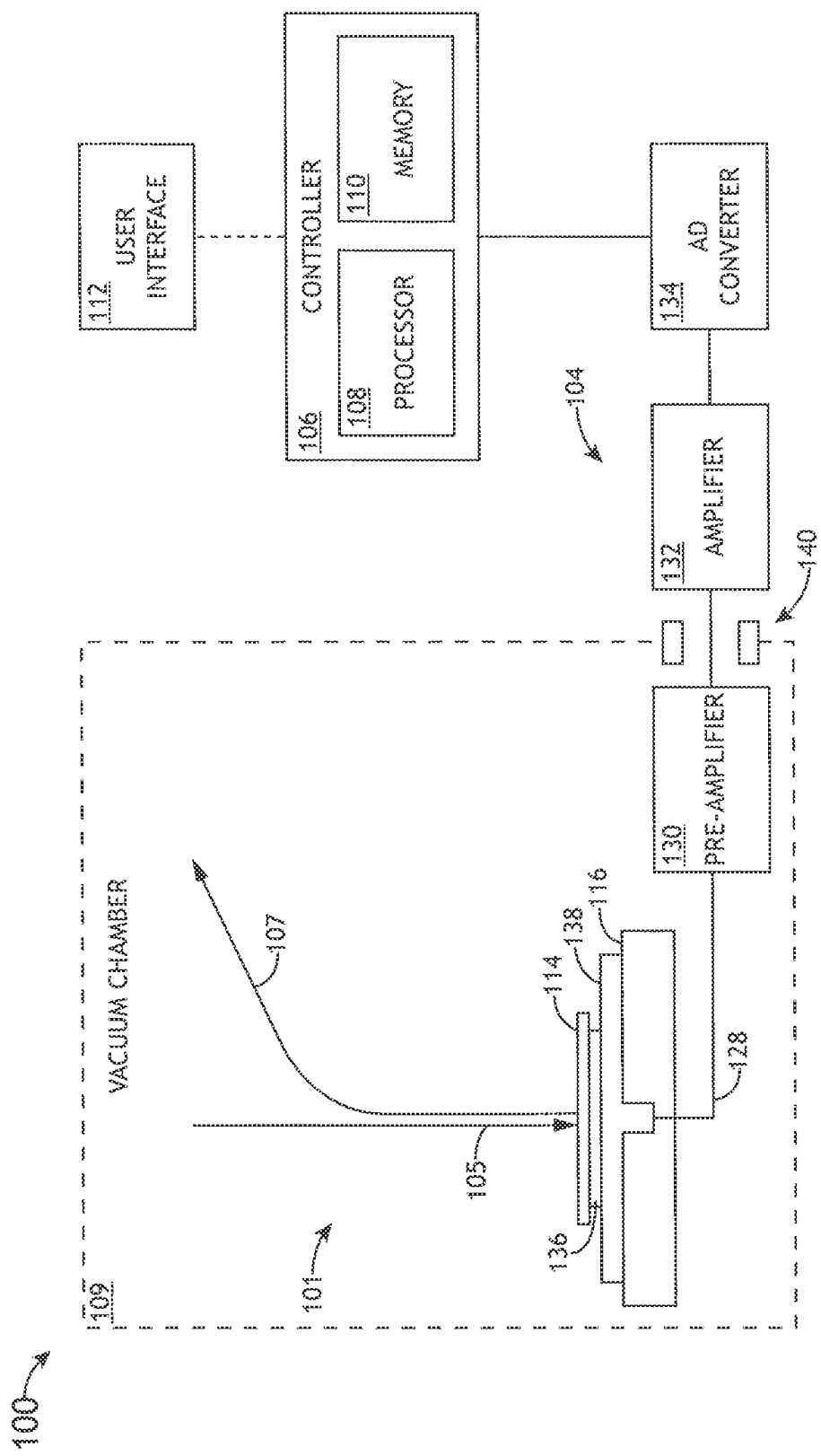
FIG. 2B illustrates a portion of a scanning electron microscopy (SEM) characterization system including one or more grounding paths, in accordance with one or more embodiments of the present disclosure.

FIG. 2B illustrates a portion of a scanning electron microscopy (SEM) characterization system 100 including one or more grounding paths 104, in accordance with one or more embodiments of the present disclosure.

As noted previously herein, the one or more grounding paths 104 may include any number and/or type of components known in the art configured to collect electron beam-induced transmission currents from the specimen 114, generate transmission signals based on the collected electron beam-induced transmission currents, and provide the transmission signals to the controller 106. For example, as shown in FIG. 2B, in additional and/or alternative embodiments, the one or more grounding paths 104 may include a layer of conductive glue 136 and/or a pedestal 138. As stated previously with respect to the grounding pins 126, the layer of conductive glue 136 and/or the pedestal 138 may be disposed and/or coupled to a surface of the specimen 114 (e.g., back side) such that they are configured to collect the one or more electron beam-induced transmission currents, which may be routed to the controller 106 via the connecting traces 128.

In another embodiment, the vacuum chamber 109 may include one or more ports 140 configured to receive the one or more connecting traces 128. The one or more ports 140 may include any structure known in the art configured to allow the one or more connecting traces 128 to pass through the vacuum chamber 109. For example, the one or more ports 140 may include, but are not limited to, a door, an aperture, a window, and the like.

In another embodiment, the one or more processors 108 of the controller 106 are configured to generate one or more transmission current images based on the one or more transmission signals. This may be further understood with reference to FIG. 3.

Figure 3:
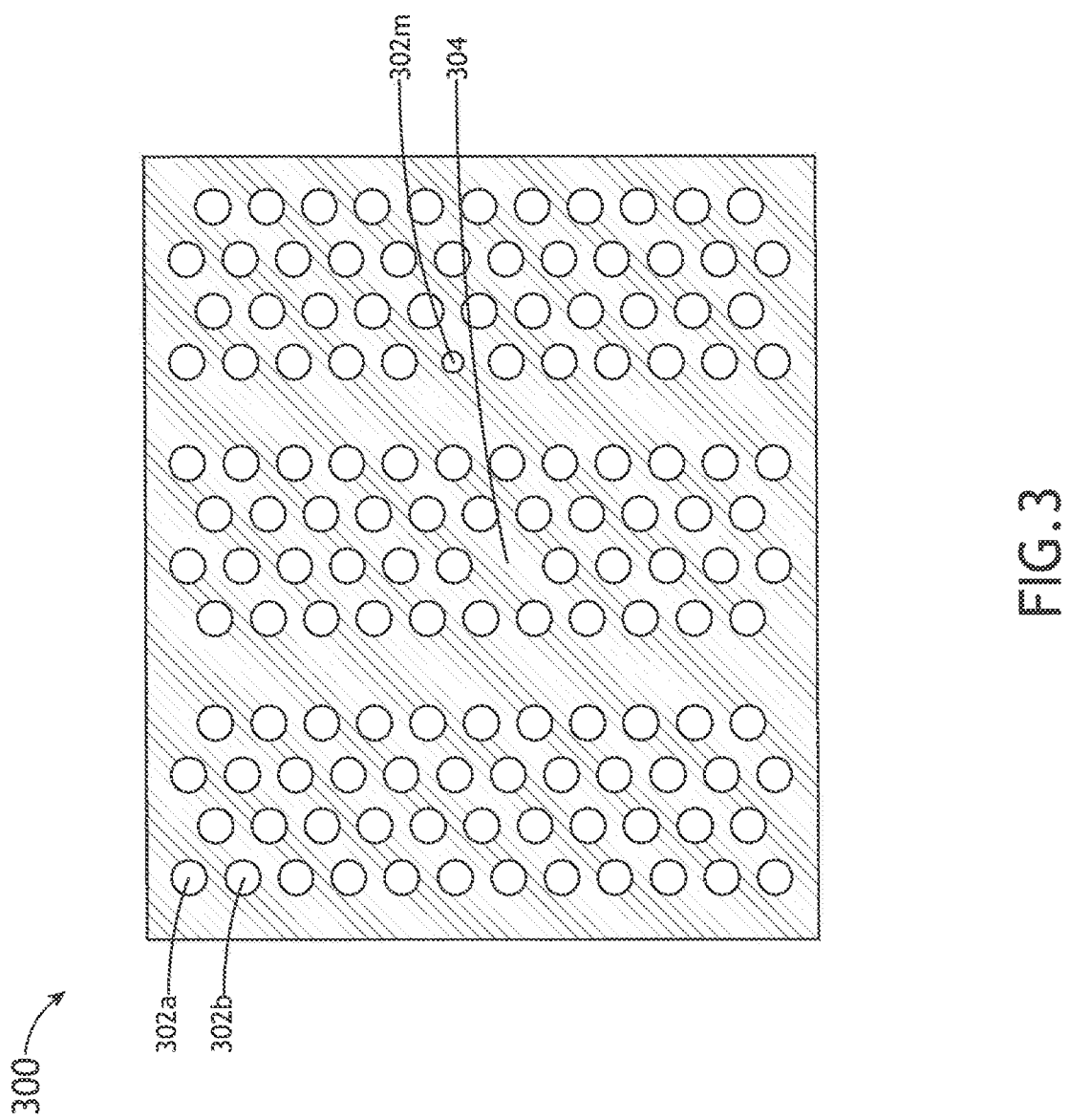
FIG. 3 illustrates a transmission current image depicting a plurality of channel holes, in accordance with one or more embodiments of the present disclosure.

FIG. 3 illustrates a transmission current image 300 depicting a plurality of channel holes 302, in accordance with one or more embodiments of the present disclosure.

In one embodiment, the controller 106 is configured to generate one or more transmission current images 300 based on the one or more transmission signals received via the grounding paths 104. The one or more transmission current images 300 may include an image of at least a portion of the specimen 114, wherein the various pixels of the transmission current image 300 are indicative of an amount/metric of electron beam-induced transmission current which were generated and passed through the portion of the specimen 114 associated with each pixel of the transmission current images 300.

In another embodiment, the processors 108 of the controller 106 are configured to generate the one or more transmission current images 300 based on the received transmission signals and positional information associated with the control signals configured to direct the scanning of the SEM sub-system 102. As noted previously herein, the one or more control signals generated by the processors 108 which are configured to cause the SEM sub-system 102 to scan the specimen 114 may include positional information indicative of the position of the electron beams 105 impinging on the specimen 114. In this regard, generating the transmission current images 300 may include identifying a position (e.g., pixel location) of the electron beam 105 on the specimen 114, and an identifying an electron beam-induced transmission current associated with the position (e.g., pixel location) based on the transmission signals. Therefore, generating the transmission current images 300 may include correlating positional information (from control signals) with respective electron beam-induced transmission currents (from transmission signals).

For example, the one or more processors 108 may be configured to identify a pixel location of a transmission current image 300 based on the one or more control signals generated by the one or more processors 108. The identified pixel location may correspond to a position on the specimen 114 scanned by the electron beam 105 (e.g., position of electron beam 105 impinging on the specimen 114). The processors 108 may then be further configured to identify a pixel gray level associated with the identified pixel location based on the one or more received transmission signals. The pixel gray level may be indicative of a metric of electron beam-induced transmission current passing through the specimen 114 at the location of the identified pixel location in response to the electron beam 105. The processors 108 may then be further configured to generate a pixel of the transmission current image 300 based on the identified pixel location and identified pixel gray level.

In this regard, relative brightness levels of the pixels of a transmission current image 300 may be associated with the relative levels of electron beam-induced transmission currents passing through the specimen 114 at the respective positions of the specimen 114 associated with each pixel. For example, high electron beam-induced transmission currents may be represented on a transmission current image 300 with bright (e.g., high luminance) pixels, whereas low electron beam-induced transmission currents may be represented on the transmission current image 300 with dim (e.g., low luminance) pixels.

In one embodiment, the one or more processors 108 may be configured to determine one or more characteristics of the specimen 114 based on the one or more generated transmission current images 300. Characteristics identified by the one or more processors 108 may include any characteristics of a specimen 114 known in the art including, but not limited to, a defect of interest (DOI), a critical dimension, and the like. For example, the one or more processors 108 may be configured to identify one or more defects of interest (DOI) within one or more HAR structures (e.g., channel holes) of the specimen 114. It is noted herein that the one or more processors 108 may be configured to identify one or more characteristics of the specimen 114 using any image processing techniques known in the art (e.g., die-to-die, cell-to-cell, image-to-known-good-image, and the like).

For example, as shown in FIG. 3, the relatively bright appearance of the first contact hole 302a and the second contact hole 302b may be indicative of a large amount of electron beam-induced transmission currents passing through the specimen 114 at the first contact hole 302a and the second contact hole 302b. In this regard, the one or more processors 108 may be configured to identify the first contact hole 302a and the second contact hole 302b as containing no DOIs.

By way of another example, contact hole 302m within the transmission current image 300 depicts a contact hole 302m which is smaller and/or not as bright as the various other contact holes 302 (e.g., contact holes 302a, 302b). This smaller and/or less bright contact hole 302m may be indicative of a smaller electron beam-induced transmission current traversing the specimen 114 through the contact hole 302m, and may therefore be indicative of a defect within the contact hole 302m. In this regard, the one or more processors 108 may be configured to identify a DOI within the contact hole 302m based on the transmission current image 300. For instance, the processors 108 may be configured to identify the contact hole 302m is partially blocked/obstructed, and/or exhibits a smaller than normal critical dimension along at least a portion of the contact hole 302m.

By way of yet another example, region 304 within the transmission current image 300 depicts region of the specimen 114 with pixels including a low luminance. This low luminance region 304 may be indicative of a smaller electron beam-induced transmission current traversing the specimen 114 through the region 304, and may be indicative of a defect. The one or more processors 108 may be configured to determine there should be a contact hole 302 depicted in region 304, and identify a DOI at region 304 based on the transmission current image 300. For instance, the processors 108 may be configured to identify the contact hole 302 at region 304 is completely blocked/obstructed.

In another embodiment, as noted previously herein, the system 100 may be configured to generate one or more SEM images based on electrons 107 emanating from the specimen 114 and detected by the electron detector assembly 122. Accordingly, the system 100 (e.g., controller 106, processors 108) may be configured to generate both SEM images and transmission current images 300. In this regard, images may be formed, by system 100 based on secondary/backscattered electrons 107 (e.g., SEM images) and/or electron beam-induced transmission currents (e.g., transmission current images 300). Furthermore, the controller 106 may be configured to identify characteristics of the specimen 114 based on the generated SEM images and/or transmission current images 300. In some embodiments, the controller 106 may be configured to compare one or more SEM images with one or more transmission current images 300 in order to identify one or more characteristics of the specimen 114.

In another embodiment, the system 100 may be configured to generate one or more SEM images and one or more transmission current images 300 concurrently (e.g., at the same time; simultaneously) or near-concurrently. For example, the controller 106 may be configured to generate one or more SEM images based on detected electrons 107 and generate one or more transmission current images 300 based on electron beam-induced transmission currents in real or near-real time such that the SEM images and transmission current images 300 are generated concurrently. It is contemplated herein that electron beam-induced transmission currents and/or secondary/backscattered electrons 107 may be analyzed by the controller 106 at high data rates, such that the transmission current images 300 and/or the SEM images may be generated at a high data rate (e.g., greater than 10 MPPS).

It is noted herein that the ability to generate both SEM images and transmission current images 300 may enable the system 100 to more effectively and efficiently identify DOIs within the specimen 114, including DOIs (e.g., CD variations) within HAR structures (e.g., contact holes 302). It is further noted herein that generating transmission current images 300 may enable system 100 to identify DOIs within a specimen 114 which are not detectable by current defect detection techniques. In particular, it is contemplated that embodiments of the present disclosure may enable detection of non-conductive remain at the bottom of contact holes 302.

In another embodiment, system 100 includes a user interface 112 communicatively coupled to the controller 106. In another embodiment, the user interface 112 includes a user input device and a display. The user input device of the user interface 112 may be configured to receive one or more input commands from a user, the one or more input commands configured to input data into system 100 and/or adjust one or more characteristics of system 100.

It is noted herein that the one or more components of the disclosed system may be communicatively coupled to the various other components of the system in any manner known in the art. For example, the SEM sub-system 102, controller 106, and user interface 112 may be communicatively coupled to each other and other components via a wireline (e.g., copper wire, fiber optic cable, and the like) or wireless connection (e.g., RF coupling, IR coupling, WiFi, WiMax, Bluetooth, 3G, 4G, 4G LTE, 5G, and the like).

In one embodiment, the one or more processors 108 may include any one or more processing elements known in the art. In this sense, the one or more processors 108 may include any microprocessor-type device configured to execute software algorithms and/or instructions. In one embodiment, the one or more processors 108 may consist of a desktop computer, mainframe computer system, workstation, image computer, parallel processor, or other computer system (e.g., networked computer) configured to execute a program configured to operate the system 100, as described throughout the present disclosure. It should be recognized that the steps described throughout the present disclosure may be carried out by a single computer system or, alternatively, multiple computer systems. Furthermore, it should be recognized that the steps described throughout the present disclosure may be carried out on any one or more of the one or more processors 108. In general, the term "processor" may be broadly defined to encompass any device having one or more processing elements, which execute program instructions from memory 110. Moreover, different subsystems of the system 100 (e.g., SEM sub-system 102, controller 106, user interface 112) may include processor or logic elements suitable for carrying out at least a portion of the steps described throughout the present disclosure. Therefore, the above description should not be interpreted as a limitation on the present disclosure but merely an illustration.

The memory 110 may include any storage medium known in the art suitable for storing program instructions executable by the associated one or more processors 108 and the data received from the SEM sub-system 102 (e.g., transmission signals, detected electron 107 signals from electron detector assembly 122). For example, the memory 110 may include a non-transitory memory medium. For instance, the memory 110 may include, but is not limited to, a read-only memory (ROM), a random-access memory (RAM), a magnetic or optical memory device (e.g., disk), a magnetic tape, a solid-state drive and the like. It is further noted that memory 110 may be housed in a common controller housing with the one or more processors 108. In an alternative embodiment, the memory 110 may be located remotely with respect to the physical location of the processors 108, controller 106, and the like. In another embodiment, the memory 110 maintains program instructions for causing the one or more processors 108 to carry out the various steps described through the present disclosure.

In one embodiment, the user interface 112 is communicatively coupled to the controller 106. In one embodiment, the user interface 112 may include, but is not limited to, one or more desktops, tablets, smartphones, smart watches, or the like. In another embodiment, the user interface 112 includes a display used to display data of the system 100 to a user. The display of the user interface 112 may include any display known in the art. For example, the display may include, but is not limited to, a liquid crystal display (LCD), an organic light-emitting diode (OLED) based display, or a CRT display. Those skilled in the art should recognize that any display device capable of integration with a user interface 112 is suitable for implementation in the present disclosure. In another embodiment, a user may input selections and/or instructions responsive to data displayed to the user via the user interface 112.

Figure 4:
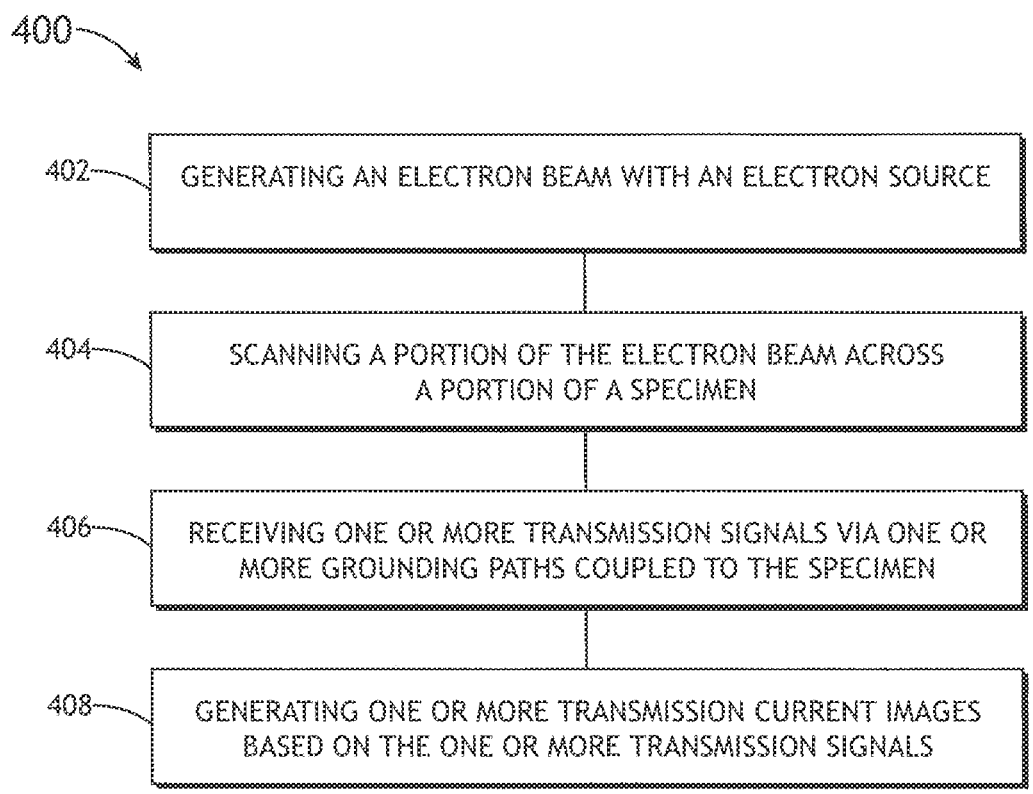
FIG. 4 illustrates a flowchart of a method for imaging a specimen utilizing one or more electron beam-induced transmission currents, in accordance with one or more embodiments of the present disclosure.

FIG. 4 illustrates a flowchart of a method 400 for imaging a specimen utilizing one or more electron beam-induced transmission currents, in accordance with one or more embodiments of the present disclosure. It is noted herein that the steps of method 400 may be implemented all or in part by system 100. It is further recognized, however, that the method 400 is not limited to the system 100 in that additional or alternative system-level embodiments may carry out all or part of the steps of method 400.

In a step 402, an electron beam is generated with an electron source. For example, as shown in FIG. 1, the one or more processors 108 may be configured to generate one or more control signals configured to cause the electron beam source 103 to generate one or more electron beams 105.

In a step 404, at least a portion of the electron beam is scanned across at least a portion of a specimen 114. For example, the one or more processors 108 may be configured to generate one or more control signals configured to cause the SEM sub-system 102 to scan at least a portion of the specimen 114 with at least a portion of an electron beam 105. It is contemplated herein that the one or more control signals generated by the one or more processors 108 may include positional information indicating the position of the electron beam 105 on the specimen 114 as the electron beam 105 is scanned across the specimen 114. The control signals and positional information associated with the control signals may be stored in memory 110.

In a step 406, one or more transmission signals are received via one or more grounding paths coupled to the specimen. For example, as shown in FIGS. 1-2B, system 100 may include one or more grounding paths 104 coupled to the specimen 114. The one or more grounding paths 104 may be further configured to receive/collect one or more electron beam-induced transmission currents, generate one or more transmission signals based on the one or more electron beam-induced transmission currents, and provide the one or more transmission signals to the controller 106.

In a step 408, one or more transmission current images are generated based on the one or more transmission signals. For example, the controller 106 may be configured to generate one or more transmission current images 300 depicted in FIG. 3 based on the one or more transmission signals received via the grounding paths 104. The one or more transmission current images 300 may include an image of at least a portion of the specimen 114, wherein the various pixels of the transmission current image 300 are indicative of an amount/metric of electron beam-induced transmission current which were generated and passed through the portion of the specimen 114 associated with each pixel of the transmission current images 300.

In additional embodiments, method 400 may include, but is not limited to including: identifying a pixel location based on the one or more control signals; identifying a pixel gray level based on the one or more transmission signals; forming the pixel in a transmission current image 300 based on the pixel location and the pixel gray level; determine one or more characteristics of the specimen 114 based on the one or more transmission current images 300; and forming one or more scanning electron microscopy images based on detected secondary/backscattered electrons 107.

One skilled in the art will recognize that the herein described components (e.g., operations), devices, objects, and the discussion accompanying them are used as examples for the sake of conceptual clarity and that various configuration modifications are contemplated. Consequently, as used herein, the specific exemplars set forth and the accompanying discussion are intended to be representative of their more general classes. In general, use of any specific exemplar is intended to be representative of its class, and the non-inclusion of specific components (e.g., operations), devices, and objects should not be taken as limiting.

Those having skill in the art will appreciate that there are various vehicles by which processes and/or systems and/or other technologies described herein can be effected (e.g., hardware, software, and/or firmware), and that the preferred vehicle will vary with the context in which the processes and/or systems and/or other technologies are deployed. For example, if an implementer determines that speed and accuracy are paramount, the implementer may opt for a mainly hardware and/or firmware vehicle; alternatively, if flexibility is paramount, the implementer may opt for a mainly software implementation; or, yet again alternatively, the implementer may opt for some combination of hardware, software, and/or firmware. Hence, there are several possible vehicles by which the processes and/or devices and/or other technologies described herein may be effected, none of which is inherently superior to the other in that any vehicle to be utilized is a choice dependent upon the context in which the vehicle will be deployed and the specific concerns (e.g., speed, flexibility, or predictability) of the implementer, any of which may vary.

The previous description is presented to enable one of ordinary skill in the art to make and use the invention as provided in the context of a particular application and its requirements. As used herein, directional terms such as "top," "bottom," "over," "under," "upper," "upward," "lower," "down," and "downward" are intended to provide relative positions for purposes of description, and are not intended to designate an absolute frame of reference. Various modifications to the described embodiments will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

With respect to the use of substantially any plural and/or singular terms herein, those having skill in the art can translate from the plural to the singular and/or from the singular to the plural as is appropriate to the context and/or application. The various singular/plural permutations are not expressly set forth herein for sake of clarity.

All of the methods described herein may include storing results of one or more steps of the method embodiments in memory. The results may include any of the results described herein and may be stored in any manner known in the art. The memory may include any memory described herein or any other suitable storage medium known in the art. After the results have been stored, the results can be accessed in the memory and used by any of the method or system embodiments described herein, formatted for display to a user, used by another software module, method, or system, and the like. Furthermore, the results may be stored "permanently," "semi-permanently," temporarily," or for some period of time. For example, the memory may be random access memory (RAM), and the results may not necessarily persist indefinitely in the memory.

It is further contemplated that each of the embodiments of the method described above may include any other step(s) of any other method(s) described herein. In addition, each of the embodiments of the method described above may be performed by any of the systems described herein.

The herein described subject matter sometimes illustrates different components contained within, or connected with, other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "connected," or "coupled," to each other to achieve the desired functionality, and any two components capable of being so associated can also be viewed as being "couplable," to each other to achieve the desired functionality. Specific examples of couplable include but are not limited to physically mateable and/or physically interacting components and/or wirelessly interactable and/or wirelessly interacting components and/or logically interacting and/or logically interactable components.

Furthermore, it is to be understood that the invention is defined by the appended claims. It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," and the like). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations). Furthermore, in those instances where a convention analogous to "at least one of A, B, and C, and the like" is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, and the like). In those instances where a convention analogous to "at least one of A, B, or C, and the like" is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, and the like). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

It is believed that the present disclosure and many of its attendant advantages will be understood by the foregoing description, and it will be apparent that various changes may be made in the form, construction and arrangement of the components without departing from the disclosed subject matter or without sacrificing all of its material advantages. The form described is merely explanatory, and it is the intention of the following claims to encompass and include such changes. Furthermore, it is to be understood that the invention is defined by the appended claims.

What is claimed:

1. A system, comprising:
    a scanning electron microscopy sub-system comprising:
       an electron source configured to generate an electron beam;
       an electron-optical assembly including one or more electron-optical elements configured to direct a portion of the electron beam onto a first side of a specimen, wherein the specimen includes a 3D-NAND device including a pattern of high-aspect-ratio holes;
    one or more grounding paths coupled to a second side of the specimen different from the first side, wherein the one or more grounding paths comprise one or more grounding pins coupled to the second side of the specimen and one or more connecting traces, wherein a first grounding pin is coupled to a first connecting trace and a second grounding pin is coupled to a second connecting trace, the one or more grounding paths configured to receive one or more electron beam-induced transmission currents transmitted through the specimen and generate one or more transmission signals based on the one or more electron beam-induced transmission currents transmitted through the specimen; and
    a controller including one or more processors configured to execute a set of program instructions stored in memory, the set of program instructions configured to cause the one or more processors to:
       generate one or more control signals configured to cause the scanning electron microscopy sub-system to scan the portion of the electron beam across a portion of the specimen;
       receive the one or more transmission signals via the one or more grounding paths;
       generate one or more transmission current images based on the one or more transmission signals; and
       identify one or more characteristics of one or more of the high-aspect-ratio holes of the 3D-NAND device based on the one or more transmission current images.

2. The system of claim 1, wherein the one or more transmission current images are further based on the one or more control signals.

3. The system of claim 2, wherein generating the one or more transmission current images based on the one or more transmission signals and the one or more control signals comprises:
    identifying a pixel location based on the one or more control signals;
    identifying a pixel gray level based on the one or more transmission signals; and
    generating a pixel in a transmission current image based on the pixel location and the pixel gray level.

4. The system of claim 1, wherein the identify one or more characteristics of one or more of the high-aspect-ratio holes of the 3D-NAND device based on the one or more transmission current images comprises:
    identify one or more under-etched high-aspect-ratio holes of the 3D-NAND device based on the one or more transmission current images.

5. The system of claim 1, wherein the one or more grounding paths comprise:
    one or more amplifiers configured to receive the one or more electron beam-induced transmission currents; and an analog-digital (AD) converter device configured to receive the one or more transmission currents and generate the one or more transmission signals.

6. The system of claim 1, wherein the scanning electron microscopy sub-system further comprises:
a detector assembly configured to detect a plurality of electrons emanating from a surface of the specimen to form one or more scanning electron microscopy images.

7. The system of claim 6, wherein forming the one or more scanning electron microscopy images is performed concurrently with generating the one or more transmission current images.

8. The system of claim 1, wherein the first side of the specimen comprises a front side of the specimen, and the second side of the specimen comprises a back side of the specimen.

9. A system, comprising:
a controller including one or more processors configured to execute a set of program instructions stored in memory, the set of program instructions configured to cause the one or more processors to:
generate one or more control signals configured to scan a portion of an electron beam across a portion of a first side of a specimen, wherein the specimen includes a 3D-NAND device including a pattern of high-aspect-ratio holes;
receive one or more transmission signals via one or more grounding paths coupled to a second side of the specimen, wherein the one or more grounding paths comprise one or more grounding pins coupled to the second side of the specimen and one or more connecting traces, wherein a first grounding pin is coupled to a first connecting trace and a second grounding pin is coupled to a second connecting trace;
generate one or more transmission current images based on the one or more transmission signals; and
identify one or more characteristics of one or more of the high-aspect-ratio holes of the 3D-NAND device based on the one or more transmission current images.

10. The system of claim 9, wherein the one or more transmission current images are further based on one or more scan signals.

11. The system of claim 10, wherein generating the one or more transmission current images based on the one or more transmission signals and the one or more scan signals comprises:
identifying a pixel location based on the one or more control signals;
identifying a pixel gray level based on the one or more transmission signals; and
generating a pixel in a transmission current image based on the pixel location and the pixel gray level.

12. The system of claim 9, wherein the identify one or more characteristics of one or more of the high-aspect-ratio holes of the 3D-NAND device based on the one or more transmission current images comprises:
identify one or more under-etched high-aspect-ratio holes of the 3D-NAND device based on the one or more transmission current images.

13. The system of claim 9, wherein the one or more grounding paths comprise:
one or more amplifiers configured to receive one or more transmission currents; and
an analog-digital (AD) converter device configured to receive the one or more transmission currents and generate the one or more transmission signals.

14. The system of claim 9, further comprising:
a detector assembly configured to detect a plurality of electrons emanating from a surface of the specimen to form one or more scanning electron microscopy images.

15. The system of claim 14, wherein forming the one or more scanning electron microscopy images is performed concurrently with generating the one or more transmission current images.

16. The system of claim 9, wherein the first side of the specimen comprises a front side of the specimen, and the second side of the specimen comprises a back side of the specimen.

17. A method, comprising:
generating an electron beam with an electron source;
scanning at least one portion of the electron beam across a portion of a specimen, wherein the specimen includes a 3D-NAND device including a pattern of high-aspect-ratio holes;
measuring one or more electron beam-induced transmission currents transmitted through the specimen via one or more grounding paths coupled to a second side of the specimen and one or more connecting traces, wherein the one or more grounding paths comprise one or more grounding pins coupled to the second side of the specimen and the one or more connecting traces, wherein a first grounding pin is coupled to a first connecting trace and a second grounding pin is coupled to a second connecting trace;
generating one or more transmission signals based on the one or more electron beam-induced transmission currents transmitted through the specimen;
generating one or more transmission current images based on the one or more transmission signals; and
identifying one or more characteristics of one or more of the high-aspect-ratio holes of the 3D-NAND device based on the one or more transmission current images.

* * * * *